(12) United States Patent
Jehle et al.

(10) Patent No.: US 7,511,442 B2
(45) Date of Patent: Mar. 31, 2009

(54) LINEAR DRIVE DEVICE

(75) Inventors: Thomas Jehle, Rheinfelden (DE); Peter Buchmann, Lupsingen (CH); Stefan Griner, Füllinsdorf (CH)

(73) Assignee: AB SKF, Göteborg (SE)

( * ) Notice: Subject to any disclaimer, the term of this patent is extended or adjusted under 35 U.S.C. 154(b) by 304 days.

(21) Appl. No.: 11/259,657

(22) Filed: Oct. 26, 2005

(65) Prior Publication Data

US 2006/0244406 A1 Nov. 2, 2006

(30) Foreign Application Priority Data

Oct. 28, 2004 (CH) .................... 1779/04

(51) Int. Cl.
*H02P 1/04* (2006.01)
(52) U.S. Cl. ........................ 318/466; 318/282; 318/286; 318/467; 318/468
(58) Field of Classification Search ................. 318/103, 318/282, 286, 466, 560, 561, 567, 568, 626, 318/640, 666, 467–469
See application file for complete search history.

(56) References Cited

U.S. PATENT DOCUMENTS

| | | | |
|---|---|---|---|
| 4,322,668 A | | 3/1982 | Trussler et al. |
| 4,529,920 A | * | 7/1985 | Yoshida et al. ............... 318/466 |
| 5,315,220 A | * | 5/1994 | Takimoto et al. ............ 318/282 |
| 5,350,076 A | | 9/1994 | Kalan |
| 5,659,468 A | | 8/1997 | Duss |
| 5,884,237 A | * | 3/1999 | Kanki et al. ................. 702/113 |
| 5,912,539 A | | 6/1999 | Sugitani et al. |
| 6,211,639 B1 | * | 4/2001 | Meister et al. ........... 318/568.2 |
| 6,577,137 B1 | | 6/2003 | Fisher |
| 6,933,843 B1 | * | 8/2005 | Hom et al. ................. 340/545.1 |
| 2003/0006869 A1 | | 1/2003 | Roither et al. |
| 2003/0052626 A1 | * | 3/2003 | Wehmeyer et al. ............. 318/85 |
| 2003/0179004 A1 | | 9/2003 | Fukusumi et al. |
| 2006/0081079 A1 | * | 4/2006 | Jaecklin et al. ............. 74/89.23 |

FOREIGN PATENT DOCUMENTS

| | | | |
|---|---|---|---|
| EP | 1457710 A1 | * | 9/2004 |
| FR | 2663473 | | 12/1991 |
| JP | 11055992 | | 2/1999 |
| WO | WO 2006/034712 | | 4/2006 |

\* cited by examiner

*Primary Examiner*—Bentsu Ro
*Assistant Examiner*—Thai Dinh
(74) *Attorney, Agent, or Firm*—McGlew and Tuttle, P.C.

(57) ABSTRACT

To obtain an improved possibility of establishing the causes of failure in linear drive devices with an electric drive, operational data logging means shall be provided for logging data in connection with operational loads and/or an operating state of the electric drive, which occur over a certain period of time, wherein the operational data logging means can be connected to the power connection means for data logging. Means for storing data, which are based on a plurality of measurements of the same measured variable, which measurements are performed one after another, make it possible to log and evaluate data over a long period of time, preferably during the entire service life of the linear drive device. The measurements are carried out during the use of the linear drive device (14) during which it is in a loaded state.

24 Claims, 6 Drawing Sheets

LINEAR DRIVE DEVICE

The present invention pertains to a linear drive device for performing essentially linear adjusting motions along a linear axis over at least part of a preset maximum stroke between two end positions, which is provided with an electric drive, whose rotary drive motion can be converted by means of gear means into translatory motions, as well as operational data logging means for logging an operating load taking place over a defined period of time and/or an operating state of the linear drive device, wherein the operational data logging means can be connected for data logging to power connection means of the electric drive.

Linear drive devices, in which a connection part is movable linearly, i.e., in a translatory manner, with an electric motor with a rotating shaft via a gear means, are used in many technical areas. The electric motor, the gear means and the connection part often form one structural unit here. The connection part is movable between a bottom dead center and a top dead center, and, of course, the designations "bottom" and "top" dead center are to cover not only the vertical direction but also any desired direction of motion.

In certain linear drive devices, which are of particular significance for the present invention, the gear means has a spindle with a thread, along which a spindle nut moves. The spindle nut is in turn located within a torque tube and is connected thereto such that it rotates in unison therewith. Since the connection part is also provided for connection to a load to be moved in a translatory manner in such a way that they move in unison, the rotary drive motion of the spindle, which is generated by means of the electric motor, is converted into a purely translatory feed motion of the spindle nut and consequently also of the torque tube.

Such drives are frequently used for safety-sensitive applications, for example, in patient beds, patient lifters, operating tables, adjusting means for positioning X-ray apparatus and the like. It is absolutely necessary especially for such fields of use that the linear drive device be used according to the conditions of use specified by its manufacturer in order to prevent overloads, both of the motor and the mechanical part, which lead to failure of the linear drive device, from occurring. Failure of the linear drive device may lead to danger to the health and life of people as well as to damage to expensive technical devices. It is therefore frequently necessary to identify the cause of the failure after a failure of a linear drive device. This has been carried out until now by examining the linear drive device. However, it is often impossible to unambiguously infer the causes of the failure from the traces of the failure.

A device and a process by which performance data of an electric motor are said to be able to be determined within the production environment even without expensive motor test benches are known from the area of the manufacture of electric motors. Thus, it is proposed in U.S. Pat. No. 6,577,137 B1 that data on the power consumption and the speed be recorded within a certain period of time for an electric motor that is not connected to a load. Performance data of the motor and especially the starting torque of the motor are determined on the basis of these measurements. However, the data that can thus be determined cannot provide any information on the causes of a possible failure of the motor, which the motor may possibly develop during a later use as intended ["den" in line 25, p. 2 is a typo for "das"-Tr.Ed.].

Devices that perform a check during the use of a vehicle to determine whether abnormal values of the motor current of an electric steering are present are known from the field of automobile chassis/steering technology through U.S. Pat. No. 5,912,539. If such abnormal values are detected, the device switches on an auxiliary unit, which is equipped with a linear drive and is to increase the steering power. This solution is also unable to contribute to the obtaining of more specific information on the causes of the failure after failure of the linear drive.

The basic object of the present invention is therefore to create an improved possibility of establishing the causes of the failure for linear drive devices of this class.

The object is accomplished in a linear drive device of the type mentioned in the introduction according to the present invention with means for storing data, wherein the data are based on a plurality of measurements of the same measured variable, which are carried out one after another, and wherein the measurements are carried out during the use of the linear drive device with a load, preferably essentially during the entire service life of the device. The object is accomplished, moreover, by a process according to patent claim 22.

The present invention is based on the discovery that mechanical overloads of linear drive devices, which will possibly lead to failure or another impairment later, can be measured already at the time of the overload on the basis of physical values or in the form of the frequency of events. This applies to both essentially one-time overloads and overloads that arise from an unacceptably high continuous stress. It was determined within the framework of the present invention that, especially in linear drive devices with a rotating spindle and conversion of the rotary drive motion into a translatory motion, which is performed by a gear, data on stresses of the device can be determined in an especially simple manner on the electric motor. However, the electric motor of this class, equipped with an operational data logging means according to the present invention, can also be used, in principle, for completely different applications than in the linear drive devices mentioned. Operational data concerning stresses occurring during operation can be determined in other applications as well, and it is thus possible to infer an existing state of wear of the particular device.

It was found that peak and/or continuous loads of the particular overall linear drive device can be inferred by determining certain measured variables that directly or indirectly depend on the electric motor. As a result, it is possible, among other things, in product liability cases, to obtain better information for the question of whether the manufacturer of the linear drive device is liable or whether an unacceptable use of the linear drive device is involved. However, a possibility, which also arises from the present invention in a highly advantageous manner, might become more significant considerably more frequently in practical use. Based on measures according to the present invention, the manufacturer can now demonstrate whether a damage to the device is covered by his warranty or whether a failure of the linear drive device can be attributed to improper use.

In a preferred embodiment of the present invention, an overall service time of the linear drive device over a certain period of time can be determined with the working load logging means. The duration of the individual operational uses can be measured for this purpose and added to the sum of the durations of the preceding individual operational uses of the electric drive or linear drive device. This makes it possible, among other things, to determine whether the guaranteed service life is already exceeded within the warranty period of a linear drive device.

However, this embodiment—just like nearly all other preferred embodiments of the present invention—also makes it possible to determine when specified maintenance intervals are reached in a markedly more accurate and simple manner.

For example, it now becomes possible to point out that a maintenance interval or the end of the service life is reached on the basis of an actual amount of past use. For example, an acoustic or optical signal may be sent for this purpose, or an e-mail or an SMS message may be automatically sent to the maintenance service of the drive manufacturer. Since compliance with specified maintenance intervals considerably contributes to the avoidance of a premature failure of the device as well, safety can also be markedly increased hereby.

Essentially the same advantages can be gained in other preferred embodiments with means with which the number of starts of the linear drive device can be determined.

The temperatures at which the drive was used can be measured in another embodiment of the present invention. Both peak temperatures and/or the temperature curve over certain periods of time may be measured. Furthermore, it may be useful to determine the overall operating times of the linear drive device on the basis of one or more temperature limit values. Unacceptably high temperatures may damage the drive and lead to its failure. Temperatures, especially the exceeding of preset temperature limits, can be determined, for example, by means of a comparator.

Determining a plurality of physical variables and/or events can contribute to the improvement of the accuracy with which the actual causes of failure can be inferred. It can be achieved by an overall consideration of a plurality of variables and/or events that the state of stress of the linear drive device can nevertheless be inferred in case of errors in the measurement of a variable or if the values of one variable (alone) are not informative for other reasons.

In another preferred embodiment, distinction can be made, for at least some of the measured variables and/or events, between the two directions of rotation of the drive shaft or the two directions of load toward the top dead center and toward the bottom dead center of the device. This may lead to an improvement of the accuracy of the evaluation especially in case of applications in which the load is usually higher in one direction of motion than in the other direction of motion. This is usually the case, for example, in linear drive devices with which a load is to be lifted, for example, in case of operating tables or patient beds.

The electric drive or the linear drive device should have storage means, for example, nonvolatile electronic storage means, to store data of measurements already performed over a longer period of time. In an advantageous variant, the device may be provided with an interface, via which the stored values can be read and data can optionally also be entered in the opposite direction. Many such interfaces and storage means are already known especially from the field of data processing.

In a preferred embodiment according to the present invention, the interface may be provided with an optical display, for example, with one or more light-emitting diodes (LEDs). The optical display may light up, for example, in green, orange or red, depending on the quantitative and/or qualitative loads that are occurring. Green signals here that the next maintenance interval or the end of the service life of the device has clearly not been reached. Orange warns that the end is near, and red signals that the maintenance interval or the end of the service life has already been exceeded.

Values that are already stored can be reproduced via the optical display in an advantageous variant of the present invention. This can be performed, for example, by blinking signals of one or more LEDs lighting for different lengths of time. The data are modulated now into corresponding light signals. Such modulation methods belong to the prior art and can be performed by a microcontroller, which also assumes other functions in the measuring means in an advantageous manner. It can be achieved by means of correspondingly rapid blinking signals that the blinking is not perceived by the human eye. Data can then be logged in a contactless manner by means of an optical sensor, which can be carried, for example, by maintenance personnel, and they can subsequently be converted into a readable and/or storable form, and they can also be evaluated even if they had not already been evaluated before.

Such a preferred embodiment has the advantage that the data can be sent in a contactless manner. Moreover, data can flow in one direction only, as a result of which data logging becomes especially tamper-proof. The interface may, of course, also permit data communication in both directions in other embodiments. Data transmission methods other than optical methods may be provided as well.

The electric drive or the linear drive device according to the present invention may be combined with an evaluating unit to form a system with which the measured values and/or the logged events can be evaluated in a preset manner and according to preset rules depending on their types. The read data can be sent for this purpose to a data processing program of the evaluating unit, in which evaluation rules in the form of program codes are stored or defined. Parameters, which depend on the amount of past use and/or the load level or the state of wear that has already developed, are to be determined here from the measured data obtained over a longer period of time. The evaluating means may be permanently connected to the linear drive device, or it can be connected to and disconnected from the linear drive device via the interface as often as desired.

For example, provisions may be made for measuring the total time, the time for all upward travels, on the one hand, and the total time that was needed for all motions in the other direction. The ratio of the times needed for the two directions of motion can then be determined with the evaluating unit. This ratio provides information on the load level. The higher the load of a drive, the more time it needs for a certain path. If the ratio exceeds a certain limit value, constant overloading of the drive in one direction of motion can be inferred.

The number of double strokes performed by the linear drive device can be determined in another advantageous embodiment of the present invention. It is assumed now that the time needed for the motion in one direction, which corresponds to the direction in which the load to be moved acts (direction of load), is independent from the load. By contrast, the time of motion in the direction of motion that counteracts the force of gravity of the load to be moved (direction opposite the direction of load) depends on the load level. Since the maximum stroke of the device is known, it can be calculated how often the device has traveled the path of the maximum double strokes. The number of double strokes may be an indicator of the state of wear and load of the linear drive device.

If the maximum on time in one direction of motion, in which higher loads usually occur, is measured, this can provide information on the greatest load or maximum load if it is assumed that the maximum stroke was also traveled in the process. Since the length of the maximum stroke as well as the time needed for the maximum stroke with the highest permissible load are known, it is also possible to determine from this whether the drive was overloaded at least once.

Furthermore, means may be present with which the maximum on time in one direction of motion, in which the load is usually lower (direction of load) than in the other direction of motion, is determined. Assuming that the maximum stroke has been traveled, information can thus be obtained on the actual maximum stroke traveled.

If means that determine the overall times for both directions of travel separately from one another are present in an embodiment, the average duration of one travel to and fro can be inferred.

It may also be advantageous if means are present for determining overvoltages of the motor. If no overvoltage is detected, it can be inferred that the drive was operated with a control provided for it. If overvoltages occur in the direction of load only, the transformer present is presumably a soft one. If, by contrast, overvoltages occur in both directions of motion, the drive was presumably operated with a control not approved by the manufacturer of the drive or with an unsuitable control.

If temperature values of the electric drive are also available for the evaluation, it can be determined by a comparison with permissible temperature values whether the temperature was unacceptably high and a possible overload of the drive can hereby be inferred. Excessively high temperatures may develop, for example, due to an excessively long on time of the drive. In particular, longer operation of the drive above a certain temperature limit is an indicator that the drive is too weak for the load to be moved and the user of the linear drive device thus made a concept error.

In the form of program codes, the evaluating unit may also store rules, which take into account past uses of the device and determine the foreseeably still available residual service life or residual duration of use until the next maintenance continuously or at certain intervals or at intervals determined by the needs. Both the quantity and the quality of past uses or stresses can be taken into account here. Unacceptably high stresses may lead to an extremely great reduction in the residual service life or the residual duration of use.

Other preferred embodiments appear from the claims, the specification as well as the figures.

The present invention will be explained in greater detail on the basis of exemplary embodiments shown purely schematically in the figures. Specifically, FIG. 1 shows a partially cut-away perspective view of a linear drive according to the present invention;

Figure 1:
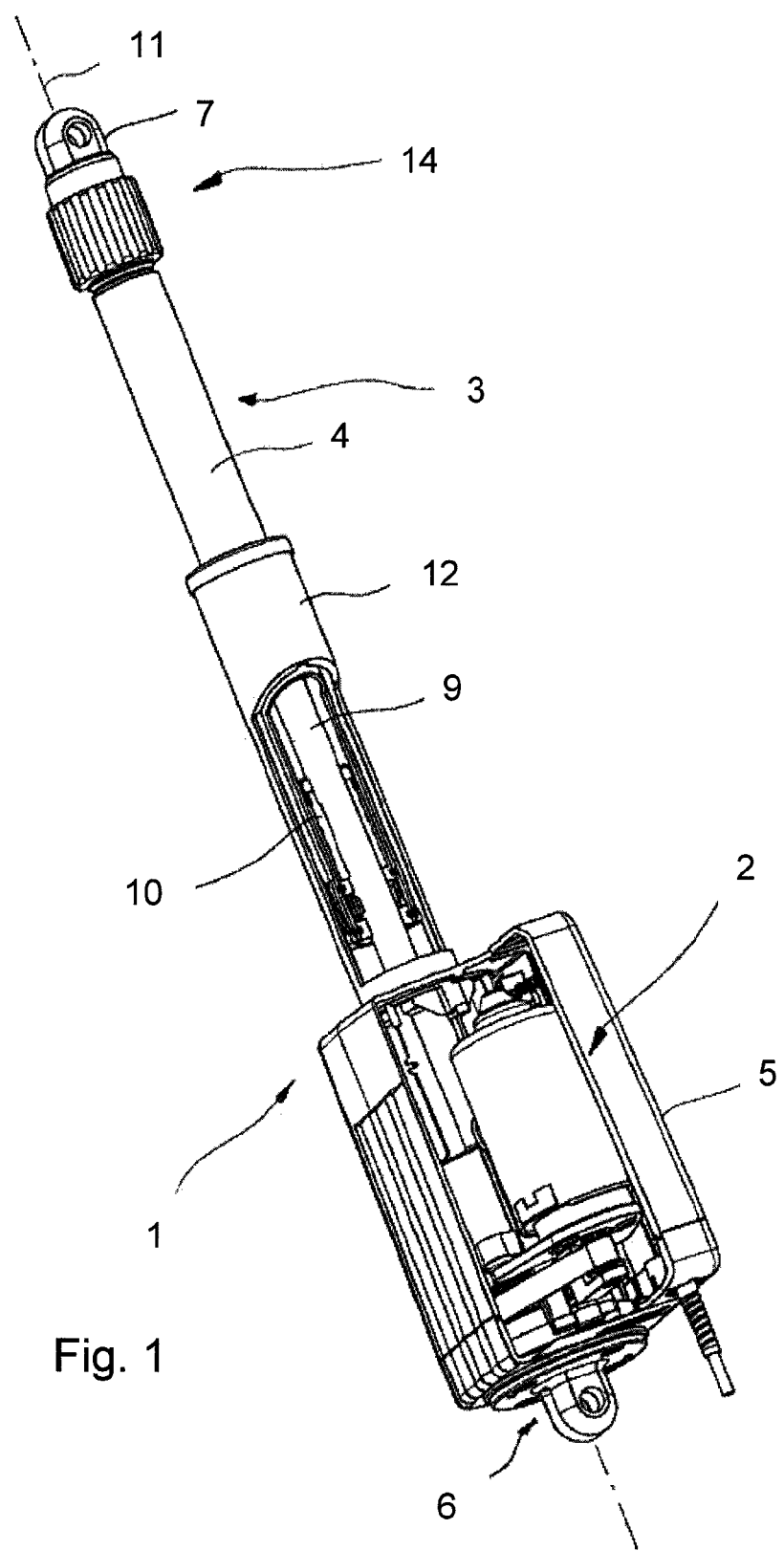

FIG. 1 shows an example of a linear drive device. This [linear drive device] has a d.c. motor 2 as an electric drive on the drive side 1, the rotary drive motion of the said d.c. motor being about a longitudinal motion of a torque tube 4 provided on a drive side 1. A drive-side fork head 6, with which the linear drive device can be fastened in a unit, medical inventory item, a piece of furniture, a machine or the like, is provided on a housing 5 of the d.c. motor 2. The principal applications of this linear drive are patient beds, operating tables, lifters, especially patient lifters, and the like.

The rotary motion of a motor shaft is transmitted to a spindle 9, which may have a non-self-locking external thread or a self-locking external thread. To convert the rotary motion of the motor into a slow motion, a reducing gear, especially an additional toothed gearing, for example, a planet gear, may be intercalated between the motor 2 and the spindle 9.

A threaded nut 10 is located on the spindle 9. Both the spindle 9 with its external thread and the threaded nut 10 with its internal thread are part of a transmission, with which the rotary drive motion of the motor 2 is converted into a translatory useful motion of the linear drive device. The threaded nut 10 is connected to the torque tube 4 and is arranged such that it rotates in unison in relation to the spindle 9. The torque tube 4 can be withdrawn into and extended from a casing 12 as a result along a longitudinal motion axis 11. Both the spindle 9, the threaded nut 10, the casing 12 and the torque tube 4 are arranged concentrically with the longitudinal motion axis 11, which is also the axis of rotation of the spindle 9. The longitudinal motion of the torque tube 4 takes place because of a rotary motion of the spindle 9, which is converted into a translatory motion of the threaded nut 10 in the known manner. Via another fork head 7, provided with a connection part, this translatory motion is transmitted from the torque tube 4 to a load, which is not shown specifically and can be attached to the fork head 7.

Figure 2:
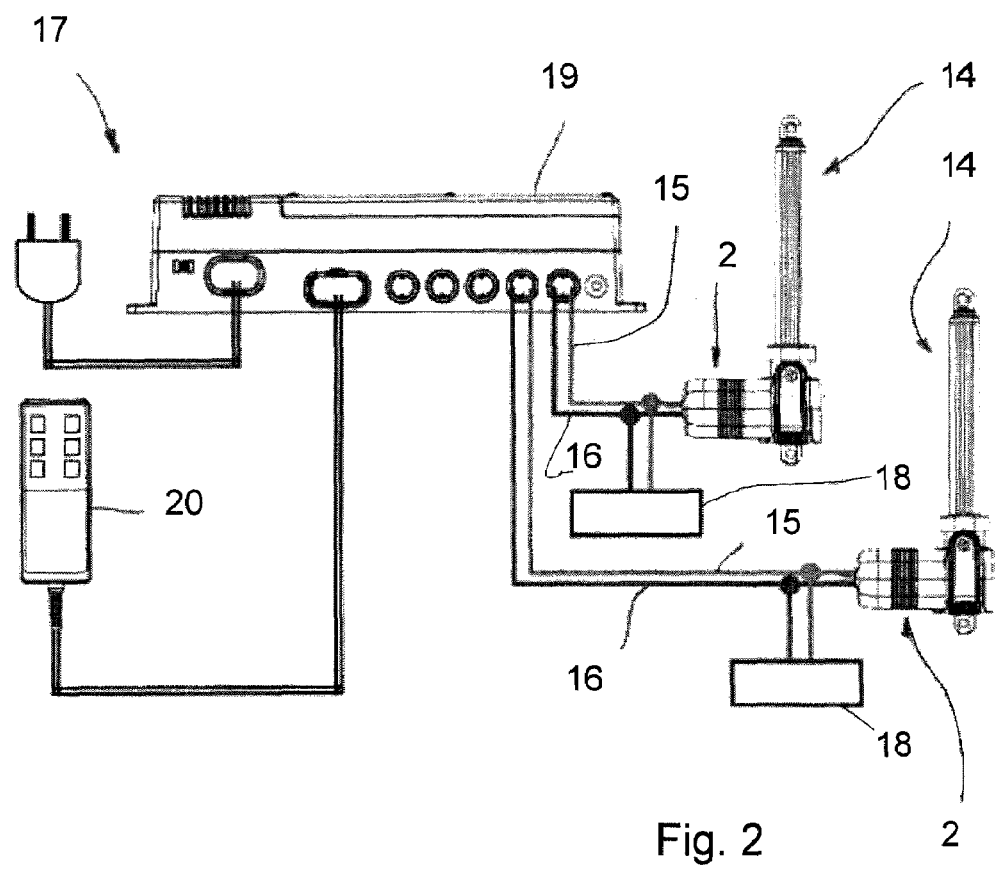
FIG. 2 shows a schematic view of the wiring of the electric motors of two linear drive devices and their electric power supply as well as measuring means for each electric motor for logging states of load of the electric motors.

Since there also are often applications in which more than one linear drive device is needed, two linear drive devices 14 which are identical to that shown in FIG. 1 are shown in FIG. 2. The plurality of linear drive devices 14 may be connected to the same control 19. However, the design of the linear drive devices will be explained below in greater detail only on the basis of one of the two linear drive devices 14.

An operational data logging means 18, shown highly schematically in FIGS. 2-7d, is connected to two drive lines 15, 16 of an electric supply unit 17 of the motor 2. In principle, it would also be possible to arrange or connect the operational data logging means 18 at another point between the electric supply unit 17 and the motor 2, for example, within the motor housing or within the linear drive device 14. The electronic unit of the operational data logging means 18 is supplied with power by the electric supply unit 17 of the motor 2. Since the power consumption of the operational data logging means 18 is negligibly low compared to the power consumption of the motor 2, this does not appreciably compromise the power supply of the motor 2.

The electric supply unit 17 is provided with a control 19, with which the motor current can be controlled. Corresponding control signals can be sent to the control 19 for this via an operating means designed as a remote control 20.

Figure 3:
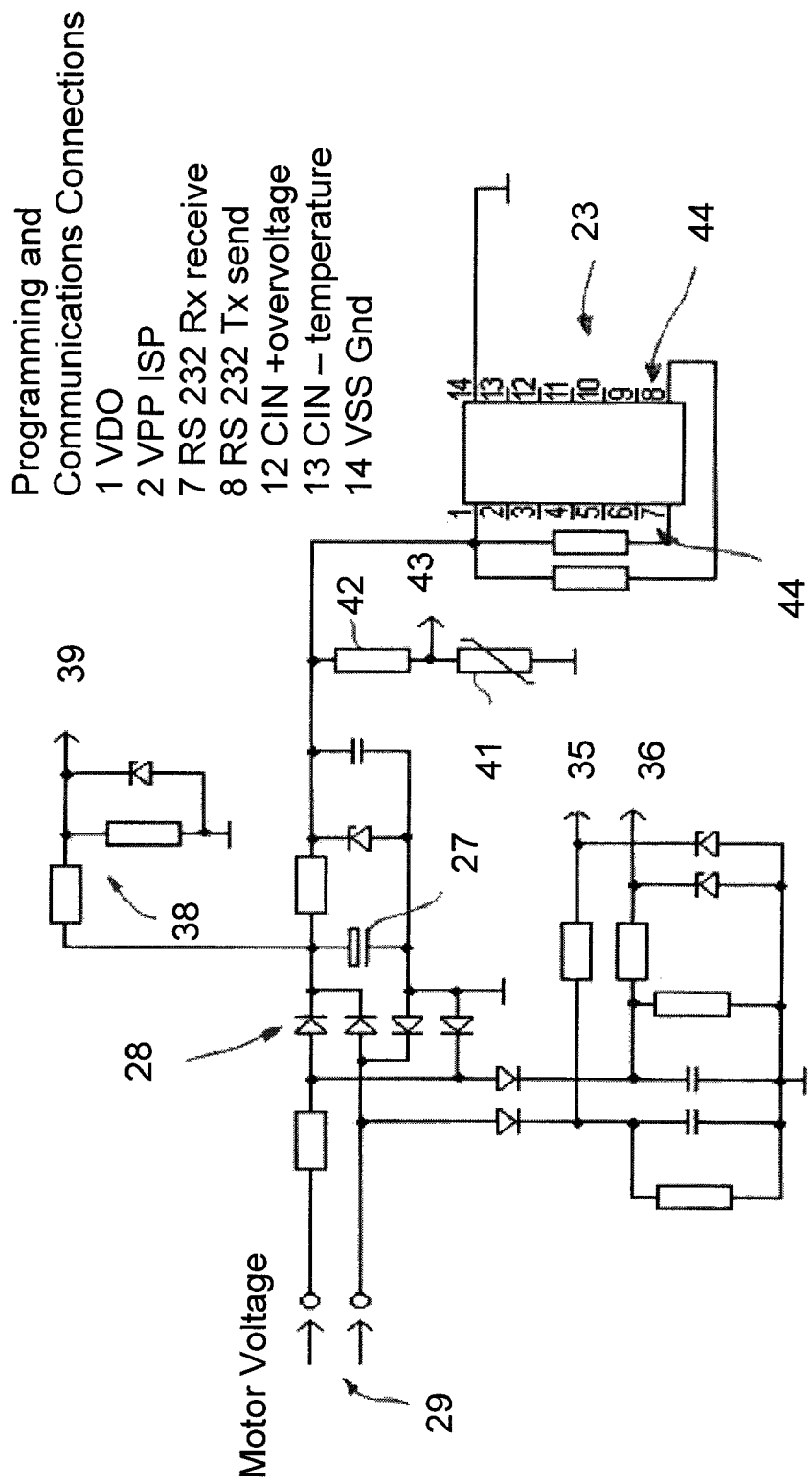
FIG. 3 shows a circuit diagram of a measuring means for logging parameters of the electric motor.
Figure 4:
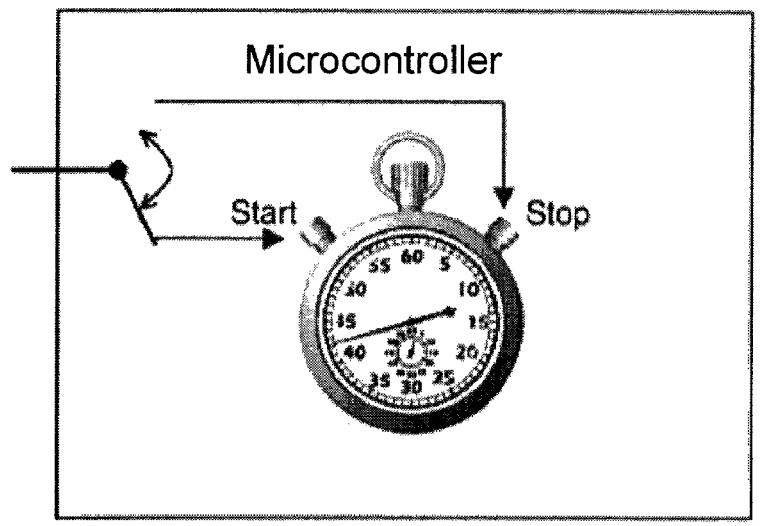
FIG. 4 shows time logging by a microcontroller of the measuring means.
Figure 5:
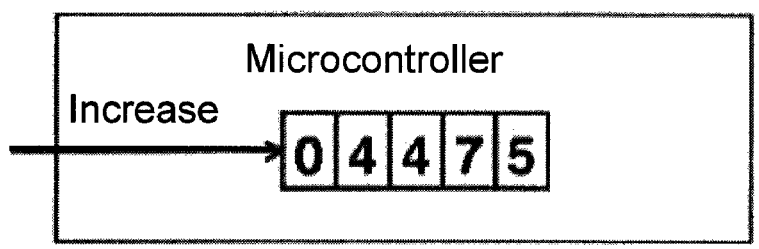
FIG. 5 shows a counter of the microcontroller.
Figure 6:
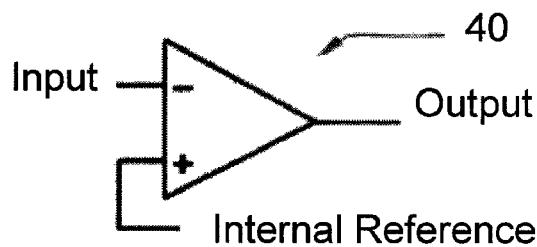
FIG. 6 shows a comparator of the microcontroller.

The operational data logging means 18 has a microcontroller 23, shown in FIG. 3, as well as a circuit, which is inserted between the drive lines 15, 16 and the microcontroller 23 and with which incoming signals (motor voltage) are processed and then sent to one of the inputs of the microcontroller 23. At least different times can be measured and the occurrence of certain events can be detected with the microcontroller 23, as this is indicated by FIGS. 4 and 5. Various events can start and stop the time measurement.

Figure 4A:
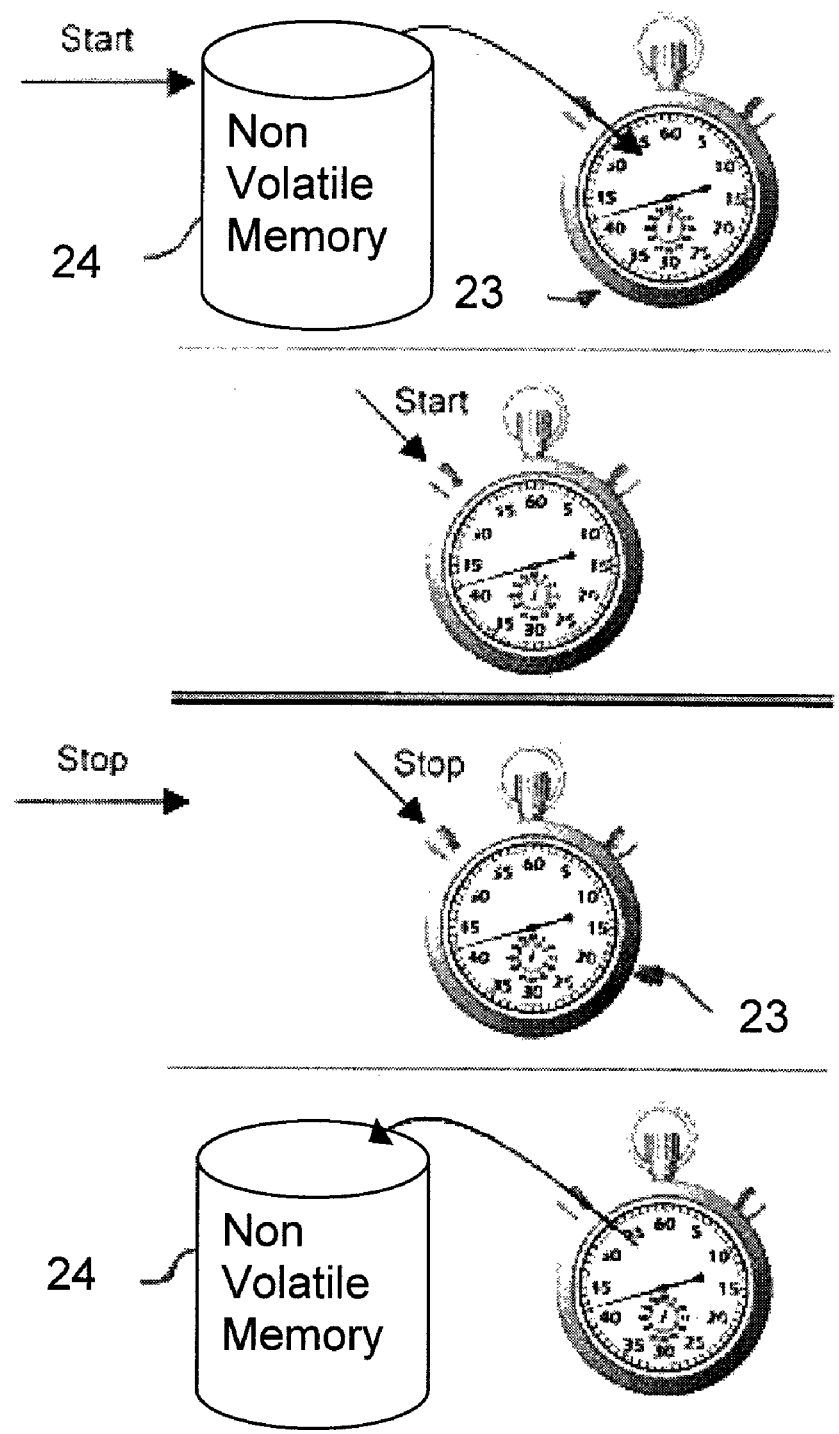
FIG. 4a shows a schematic view of the measuring operation.

As is indicated in the upper part of FIG. 4a, in case of a start event triggering the data logging, the microcontroller 23 reads the value for the same measured variable, which value is stored in the memory 24 on the basis of the preceding measurement. For example, the start of a motion of the torque tube in one of the two possible directions of motion, exceeding of a limit value of the motor voltage or of the temperature may be used as a start event. In addition, the measurement or data logging starts now. The measurement ends as soon as a stop event occurs, for example, the stopping of the drive motion, or a motor voltage or temperature below the respective limit values. The result of the measurement is then stored by the microcontroller in the nonvolatile memory 24. If measured data are not directly related to measured data determined already beforehand, reading of the measured value of the particular measured variable that was entered in the memory last may not take place at all. For example, provisions may be made for these cases for storing one or more values for each measurement in the memory 24 separately and independently from other measured values.

All measured times are preferably added to already measured times of the same event. The sum of the number of certain measured events is likewise increased by one each time as soon as the corresponding type of event occurs again. This is indicated in the two FIGS. 4 and 5. The particular preceding sum stored in the nonvolatile memory 24 of the microcontroller 23 is overwritten with the particular sum thus determined. Moreover, provisions may be made for storing the highest individual time value determined for a certain type of event as such. The microcontroller 23 is capable of processing a plurality of such types of events in the manner described.

The microcontroller 23 is provided, furthermore, with two inputs of an internal comparator (FIG. 6), both of which can be compared with an internal reference voltage.

FIG. 3 and FIGS. 7a-7d show the circuit diagram of the operational data logging means 18, which logs the data derived from the motor voltage by means of the microcontroller 23. Protection of the data is triggered by the sudden absence of the supply voltage at one or more inputs of the controller 23. The supply voltage breaks down, for example, if the electric drive of the linear drive device is switched off by a user via a manual switch, not shown more specifically. The power supply of the controller 23 itself is ensured by a sufficiently highly dimensioned capacitor 27, which is charged during the operation of the linear drive device. After the failure of the supply voltage of the linear drive device, the capacitor 27 can supply the controller 23 with electricity for a sufficiently long time to store the collected data.

Figure 7A:
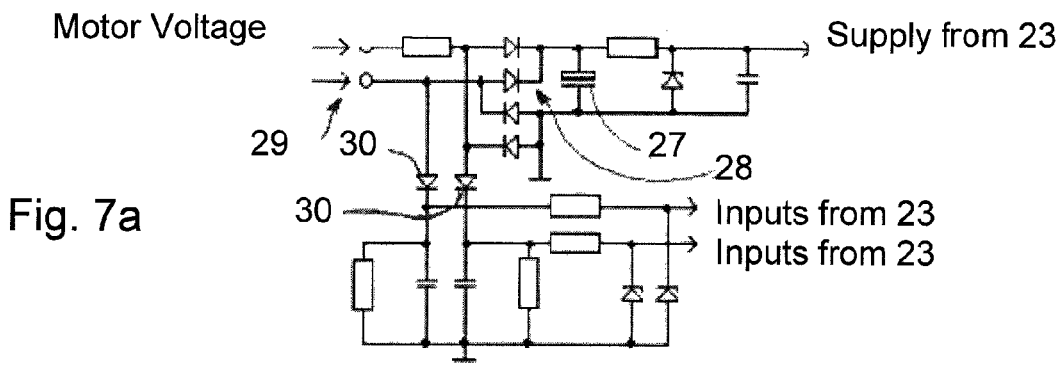
FIG. 7a shows part of the circuit from FIG. 3, with which the storage operation is triggered.

FIG. 7a shows the part of the circuit from FIG. 4 with which the storage operation is triggered. As is shown here, the supply is supported by the capacitor 27 and uncoupled from the input 29 by the rectifier 28. The energy being stored in the capacitor 27 is needed after the failure of the supply voltage for the data storage operation in a nonvolatile memory (FIG. 4a) of the controller 23. With the two diodes 30, one or the other of the diodes 30 becomes conductive as the polarity on the motor changes over, and the information on the direction and on the presence of a supply voltage on the controller 23 is passed on.

Figure 7B:
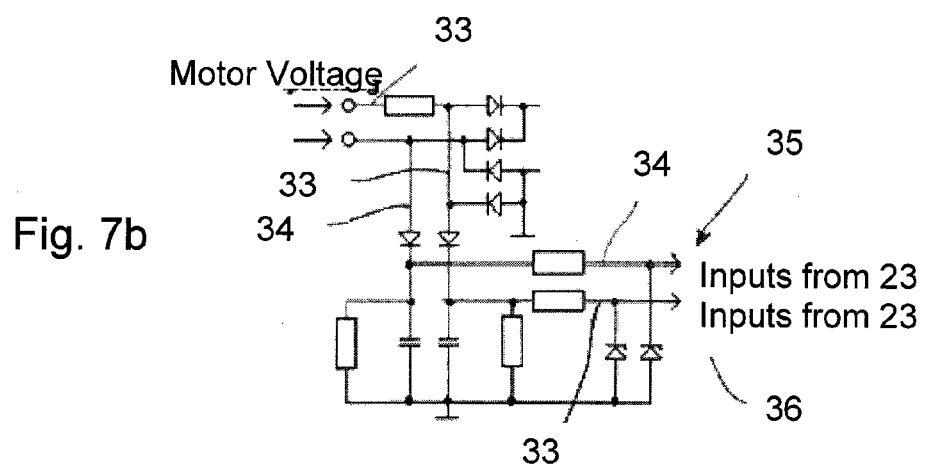
FIG. 7b shows part of the circuit from FIG. 3, with which the direction of rotation of the motor can be recognized.

FIG. 7b shows the part of the circuit from FIG. 4 with which the direction of rotation of the motor and consequently also the particular direction of motion are recognized. The paths that are important for the recognition of the direction are designated by 33 and 34. The circuit causes that depending on the direction of rotation of the motor, an input signal is present only at a preset input of the two inputs 35, 36 of the processor. If the direction of rotation of the motor changes over, the signal, which corresponds to the direction of rotation of the motor, will also be present on the respective other of the two inputs 35, 36.

Figure 7C:
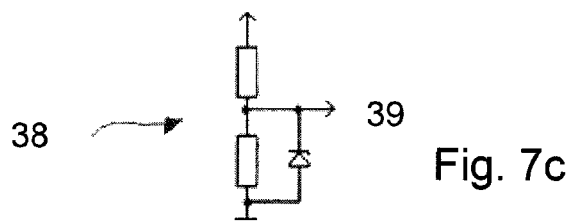
FIG. 7c shows part of the circuit from FIG. 3, with which an overvoltage can be detected.

The recognition of overvoltage is brought about by the voltage divider 38, which is shown in FIG. 7c and makes available for the controller 23, at its input 39, an analog voltage, which is lower by a factor than the voltage that is actually present. The voltage value is compared in the controller with a reference voltage value by means of a comparator 40 (FIG. 6) and detected as an overvoltage if the reference voltage is exceeded.

Figure 7D:
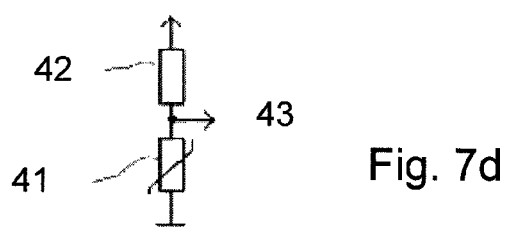
FIG. 7d shows part of the circuit from FIG. 3, with which temperature limit values can be detected.

The temperature is detected by the temperature variable resistor 41, which is shown in FIG. 7d and which changes the resistance analogously to its ambient temperature. The temperature variable resistor 41 is connected in series to another resistor 42 and forms a voltage divider as a result. This circuit sends a voltage, whose value changes with the value of the temperature, to the input 43 of the controller. The voltage value, which is generated by the resistors 41, 42 connected in series, is compared with a reference voltage with an internal comparator circuit (for example, FIG. 6) of the controller. If the analog voltage reaches or exceeds the value of the reference voltage, the comparator output jumps to logic 1, or, in the inverse case, to logic 0. By changing the reference voltage, it is also possible to detect different temperature limit values with this circuit part.

All voltage values present on the inputs of the microcontroller 23 are digitized and optionally subjected to further processing by the microcontroller. The data, which are then stored in a nonvolatile memory, can be read via an interface 44.

LIST OF REFERENCE NUMBERS

1 Drive side
2 D.c. motor
4 Torque tube
5 Housing
6 Fork head
7 Fork head
9 Spindle
10 Threaded nut
11 Longitudinal motion axis
12 Casing
14 Linear drive device
15 Drive line
16 Drive line
17 Electric supply unit
18 Operational data logging means
19 Control
20 Remote control
23 Microcontroller
24 Memory
27 Capacitor
28 Rectifier
29 Input
30 Vertical diodes
33 Electric path
34 Electric path
35 Input
36 Input
38 Voltage divider
39 Input
40 Comparator
41 Resistor
42 Resistor
43 Input
44 Interface

The invention claimed is:

1. A device for determining a state of wear of a linear drive device, the device comprising:
   an electric supply unit comprising two drive lines;
   a linear drive device comprising an electric motor and a means of converting a rotary motion of said electric motor into a linear movement along a linear axis, said electric motor being coupled to said two drive lines of said electric supply unit;
   a measuring means for measuring a voltage between said two drive lines;
   a storage means for storing one or more measured voltages;
   an evaluating means for evaluating said one or more stored voltages such that said evaluating means determines a state of wear of said linear drive device based on said one or more stored voltages.

2. A device in accordance with claim 1, wherein said measuring means only measures one of said voltages when said linear drive device is actuated.

3. A device in accordance with claim 1, further comprising a time measurement means for measuring a time of use of said linear drive device, said storage means storing one more measured times of use, said evaluating means determining said state of wear of said linear drive device based on said stored one or more measured times of use and said one or more stored voltages.

4. A device in accordance with claim 1, further comprising a plurality of double stroke counting means for counting one or more double strokes executed via said linear drive device, said storage means storing said one or more counted double strokes, said evaluating means determining said state of wear of said linear drive device based on said stored one or more counted double strokes and said one or more measured voltages.

5. A device in accordance with claim 4, wherein said double stroke counting means measures polarity changes of said voltage between said two drive lines.

6. A device in accordance with claim 1, further comprising a temperature measurement means for measuring a temperature of said electric motor, said storage means storing one or more measured temperatures, said evaluating means determining said state of wear of said linear drive device based on said one or more measured voltages and said one or more measured temperatures.

7. A device in accordance with claim 1, wherein said evaluating means provides a maintenance interval as output based on said determined state of wear of said linear drive device.

8. A device in accordance with claim 7, further comprising an interface means for communicating said output.

9. A device in accordance with claim 8, wherein said interface means communicates said output optically.

10. A device in accordance with claim 9, wherein said optical communication corresponds to red, orange or green based on said state of wear of said linear drive device.

11. A device in accordance with claim 9, further comprising an optical sensor, wherein said optical communication is via blinking signals, said optical sensor receiving said blinking signals in a contactless manner such that said blinking signals are stored in said optical sensor.

12. A device in accordance with claim 8, wherein said interface means communicates said output acoustically.

13. A device in accordance with claim 8, wherein said interface has an optical display, with which data is display in light signals.

14. A device in accordance with claim 1, wherein said evaluating means provides an end of service life signal as output based on said determined state of wear of said linear drive device.

15. A device in accordance with claim 1, wherein said measuring means, said storage means and said evaluating means is integrally connected to said linear drives.

16. A device in accordance with claim 1, wherein said evaluating means is provided with a means for distinguishing different directions of linear drive device.

17. A device in accordance with claim 1, further comprising an overvoltage determining means for determining whether an overvoltage is induced on said electric motor.

18. A device in accordance with claim 1, wherein said evaluating means determines an operational load and/or an operating state of said linear drive device based on said one or more measured voltages.

19. Linear drive device in accordance with claim 1, wherein said storing means is tamper-proof such that access to data stored in said storing means is prevented.

20. A linear drive system, comprising:
   an electric supply unit comprising a first pair of drive lines and a second pair of drive lines;
   a first linear drive device comprising a first electric motor and a first means for converting a first rotary motion of said first electric motor into a first linear movement, said first electric motor being connected to said electric supply unit via said first pair of drive lines;
   a second linear drive device comprising a second electric motor and a second means for converting a second rotary motion of said second electric motor into a second linear movement, said second electric motor being connected to said electric supply via said second pair of drive lines;
   a first measuring means for measuring a first voltage between said first pair of drive lines;
   a second measuring means for measuring a second voltage between said second pair of drive lines;
   a first storage means for storing one or more first measured voltages;
   a second storage means for storing one or more second measured voltages;
   a first evaluating means for determining a state of wear of said first linear drive device based on said one or more first measured voltages;
   a second evaluating means for determining a state of wear of said second linear drive device based on said one or more second measured voltages.

21. Furniture, especially medical furniture, comprising:
   a furniture structure comprising a linear device, said linear device comprising:
      an electric motor and a means for converting a rotary motion of said electric motor into a linear movement along a linear axis;
      an electric supply unit comprising two drive lines;
      a measuring means for measuring a voltage between said two drive lines;
      a storage means for storing one or more measured voltages;
      an evaluating means for determining a state of wear of said linear device based on one or more stored voltages.

22. A process for determining the condition of a linear drive device, the process comprising:
   providing an electric supply unit comprising two drive lines;
   providing a linear device comprising an electric motor and a means for converting a rotary motion of said electric into a linear movement, said electric motor of said linear drive device being connected to said electric supply unit via said two drive lines;

measuring a voltage between said two drive lines;

providing an evaluating device;

storing one or more measured voltages in a storage device; and determining a state of wear of said linear drive device based on said measured voltage via said evaluating device.

23. A process in accordance with claim 22, wherein said evaluating device determines said state of wear of said linear drive device via data received when said linear drive device is actuated.

24. A process in accordance with claim 22, wherein data corresponding to a motor voltage of said electric motor of said linear drive device when said linear drive device is activated is stored in said storage element.

* * * * *